United States Patent
Goto

(10) Patent No.: US 8,193,511 B2
(45) Date of Patent: Jun. 5, 2012

(54) METHOD OF CALIBRATING BEAM POSITION IN CHARGED-PARTICLE BEAM SYSTEM

(75) Inventor: Kazuya Goto, Tokyo (JP)

(73) Assignee: JEOL Ltd., Tokyo (JP)

(\*) Notice: Subject to any disclaimer, the term of this patent is extended or adjusted under 35 U.S.C. 154(b) by 819 days.

(21) Appl. No.: 12/351,276

(22) Filed: Jan. 9, 2009

(65) Prior Publication Data

US 2009/0189062 A1     Jul. 30, 2009

(30) Foreign Application Priority Data

Jan. 24, 2008  (JP) ................... 2008-013541

(51) Int. Cl.
*G01D 18/00*     (2006.01)
(52) U.S. Cl. .......... 250/396 R; 250/252.1; 250/492.1; 250/400; 250/397; 313/361.1
(58) Field of Classification Search ........... 250/252.1, 250/492.1, 400, 396 R, 397; 313/361.1
See application file for complete search history.

(56) References Cited

U.S. PATENT DOCUMENTS

| | | | |
|---|---|---|---|
| 4,117,340 A | 9/1978 | Goto et al. | |
| 4,151,422 A | 4/1979 | Goto et al. | |
| 6,426,501 B1* | 7/2002 | Nakagawa | ............ 850/5 |
| 7,518,121 B2* | 4/2009 | Maas et al. | ......... 250/396 R |
| 7,964,844 B2* | 6/2011 | Kimba | ............ 250/310 |
| 8,080,790 B2* | 12/2011 | Yamazaki et al. | ...... 250/311 |

FOREIGN PATENT DOCUMENTS

| | | |
|---|---|---|
| JP | 2002-246303 | 8/2002 |
| JP | 2004-311472 | 11/2004 |

\* cited by examiner

*Primary Examiner* — David Porta
*Assistant Examiner* — Djura Malevic
(74) *Attorney, Agent, or Firm* — The Webb Law Firm

(57) ABSTRACT

A method of calibrating the beam position in a charged-particle beam system starts with finding a focus deviation on the material surface for each point within a deflection field. A focus correction voltage $V_F$ necessary to cancel out the focus deviation is determined. A beam position deviation $f_i$ per unit focus correction voltage is found. The deflection voltage is corrected so as to cancel out the product $f_i \cdot V_F$. The deflection voltage is corrected so as to cancel out the sum of the product $f_i \cdot V_F$ and the measured deflection field distortion while correcting the focus based on the voltage $V_F$.

2 Claims, 3 Drawing Sheets

METHOD OF CALIBRATING BEAM POSITION IN CHARGED-PARTICLE BEAM SYSTEM

BACKGROUND OF THE INVENTION

1. Field of the Invention

The present invention relates to calibration of the beam position in a charged-particle beam system, such as a scanning electron microscope or electron beam lithography system. More specifically, the invention relates to a method of calibrating deviation of the beam position accompanying a focus correction.

2. Description of Related Art

FIG. 3 schematically shows an electron optical system for use in an electron beam lithography system. This optical system is shown as an example of an electron optical system for use in a charged-particle beam system. In this electron optical system, an image 3 of an object 2 is first formed by a first lens 1. It is conceivable that the object 2 is a shaped apertured plate illuminated with an electron beam (e.g., aperture plate 4 shown in FIG. 1 of U.S. Pat. No. 4,151,422), an electron source, such as an electron gun, or their images.

Then, an image 5 of the image 3 is formed by a second lens 4 on a surface 6 on which a photosensitive material is applied. Under this state, a deflector 7 is operated to deflect an electron beam 8 such that the image 5 is directed at a desired position on the material surface 6. As a result, a desired pattern is written at the desired position on the material surface 6.

The deflection field, i.e., the range deflected by the electron beam 8, is about 1 mm square. A pattern can be written even outside the deflection field by horizontally moving the material stage (not shown) on which the material is carried.

Generally, electromagnetic lenses are used as the first lens 1 and second lens 4. An electrostatic deflector is used as the deflector 7 to provide high deflection speeds.

As the beam is deflected by the deflector 7, deflection aberrations, including comatic aberration, curvature of field aberration (out of focus), astigmatism, distortion aberration (deflection field distortion), and chromatic aberration, are produced.

On the other hand, the height of the material surface 6 is generally not uniform but has a distribution. Furthermore, the height of the material surface 6 relative to the image 5 varies because the material stage moves up and down as this stage moves horizontally. As a result, the image will go out of focus. Also, the beam position on the material surface 6 (i.e., the incident position of the beam on the material surface 6) will deviate from the correct position. These out-of-focus conditions and deviations of the beam position can be treated as aberrations in a broad sense.

Of these aberrations, what are generally corrected by an electron beam lithography system are curvature of field aberration (out of focus), astigmatism, and distortion aberrations (deflection field distortion and beam position deviation). The curvature of field aberration and astigmatism are corrected by electrostatic or electromagnetic correctors. On the other hand, the distortion aberration is corrected by superimposing a correction signal for a positional deviation onto a deflection signal used for positioning.

In the electron optical system shown in FIG. 3, focus correction is made at high speed using an electrostatic focus corrector 9 according to the deflection position. In FIG. 3, none of astigmatic corrector and computing unit for correction of distortion aberration is shown. The focus corrector 9 is made of a cylindrical conductor. When a voltage is applied to the focus corrector 9 relative to a surrounding potential (normally zero potential), the potential distribution in the magnetic field produced by the first lens 1 varies, changing the velocity of electrons passing through the lens 1. This, in turn, varies the intensity of the first lens 1 for electrons. Consequently, the heightwise positions of the images 3 and 5 vary. That is, the heightwise position of the focus relative to the material surface 6 varies.

The aberrations are corrected by the aforementioned method but correction residues (such as overcorrection or undercorrection) are produced. Therefore, it is desired that the aberrations not yet corrected be reduced as much as possible.

One of the causes of correction residues is error produced when aberrations are measured. The method of measuring aberrations is already known. A microscopic pattern of a knife edge or a mesh of a heavy metal is scanned with the electron beam 8. The resulting signal (e.g., a signal based on an absorption current, a signal based on backscattered electrons, or a signal based on secondary electrons) is computationally processed. Thus, the aberrations are measured.

Furthermore, new aberrations produced concomitantly with correction create a cause of generation of correction residues. For example, distortion aberration shows nonlinearity with respect to the deflection voltage. Therefore, if the electron beam 8 is deflected by an amount corresponding to the distortion aberration to correct the beam position, the deflection brings about new distortion aberration, curvature of field aberration, and astigmatism.

In addition, depending on the configuration of the electron optical system, if a focus correction is made, the deflection sensitivity may vary. This can also be treated as a distortion aberration in a broad sense.

Although these correction residues can be made to converge within a certain value by repeating measurement and correction, if aberrations not yet corrected are great, the aberrations are converged slowly. This prolongs the measurement time.

This problem is especially conspicuous in measurement of deflection field distortion for the following reason. The deflection field distortion is corrected by deflecting the electron beam at a large number of points (e.g., 10×10=100 points) in one deflection field and, thus, an exorbitantly long time is taken to make the measurement.

In the system shown in FIG. 3, the object 2 seems to be located on the center axis of the magnetic field set up by the first lens 1. In practice, however, the object 2 often deviates from the center axis of the magnetic field produced by the first lens 1 because the positioning accuracy has a limitation.

Additionally, if the first lens 1 has been produced or assembled at low accuracy or the whole lens is tilted, the center axis of the magnetic field generated by the first lens 1 deviates or tilts. Under these conditions, if the object 2 is located on the proper center axis of the magnetic field, the object 2 actually deviates from the center axis of the field produced by the first lens 1. On the center axis of the magnetic field, electrons traveling through the lens do not vary in velocity. That is, on the center axis, the electron orbit is not affected by the presence or absence of the lens. If the lens is built axisymmetrically, the center axis of the magnetic field is coincident with the axis of axisymmetry.

If a focus correction is made, the projection magnification varies. At this time, if the object 2 deviates from the center axis of the magnetic field produced by the first lens 1, the beam position is made to deviate by a variation in the projection magnification. That is, the position on the material surface 6 at which the beam impinges varies. The beam position deviation is added to distortion aberration, increasing the deflection field distortion.

Accordingly, it is desired that the deflection field distortion be reduced before measurement by previously measuring beam position deviation accompanying a focus correction and causing the beam position to be corrected according to the amount of focus correction.

However, apparently nothing is known as to how a beam position deviation accompanying a focus correction should be measured. Furthermore, apparently nothing is known as to how the amount of correction to the deviation should be determined.

SUMMARY OF THE INVENTION

It is an object of the present invention to provide a method of calibrating a beam position in a charged-particle beam system in such a way that beam position deviation accompanying a focus correction can be measured easily and accurately and that the beam position can be corrected based on the result of the measurement.

A first embodiment of the present invention provides a method of calibrating a beam position in a charged-particle beam system in which a focused charged-particle beam is made to hit a material at an arbitrary position by deflecting the beam. The method comprises the following steps:

Focus deviation on a material surface caused by a beam deflection performed by application of a deflection voltage of $V_D$ to a deflector is found for each point within a deflection field. A focus correction voltage $V_F$ necessary to cancel out the focus deviation is determined (step S1).

Based on the determined correction voltage, focus correction voltages $V_{F1}$ and $V_{F2}$ about two arbitrary points given by $u_{i1}=d_i \cdot V_{D1}$ and $u_{i2}=d_i \cdot V_{D2}$ are determined, the two points providing point symmetry with respect to the center of the deflection field. Under focus-corrected conditions, beam position deviations $dU_{i1}$ and $dU_{i2}$ at the points $u_{i1}$ and $u_{i2}$ are measured (step S2).

A beam position deviation $f_i$ per unit focus correction voltage is found from the positional deviations $dU_{i1}$ and $dU_{i2}$ and from the focus correction voltages $V_{F1}$ and $V_{F2}$ (step S3).

Deflection field distortion is measured while correcting the deflection voltage so as to cancel out the product $f_i \cdot V_F$ of beam position deviation $f_i$ and focus correction voltage $V_F$ while making focus correction based on focus correction voltage $V_F$ at each point within the deflection field, the focus correction voltage $V_F$ being obtained in step 1 (step S4).

The deflection voltage is corrected so as to cancel out the sum of the product $f_i \cdot V_F$ and the deflection field distortion measured in step 4 while the focus is corrected based on the focus correction voltages $V_F$ obtained in step S1. During this process, measurement of the deflection field distortion is repeated to converge the deflection field distortion to less than a desired value (step S5).

A second embodiment of the present invention provides a method of calibrating a beam position in a charged-particle beam system in which a focused charged-particle beam is made to hit a material at an arbitrary position by deflecting the beam. This method permits beam positions measured at two beam measurement surfaces at different heights to be calibrated with each other. The method comprises the following steps:

Focus correction voltages $VF_1$ and $VF_2$ are found for the two beam measurement surfaces at the different heights (step S1).

Focus correction is made for the two beam measurement surfaces. At the same time, beam position deviations $dU_{i1}$ and $dU_{i2}$ accompanying the focus correction for each beam measurement surface are measured, thus finding a beam position deviation $f_i$ per unit focus correction voltage (step S2).

The deflection voltage is corrected to cancel out the product $(f_i \cdot (V_{F2}-V_{F1}))$ of the beam position deviation $f_i$ and the difference $(V_{F2}-V_{F1})$ between the focus correction voltages for the beam measurement surfaces, respectively, while correcting the focus at the two beam measurement surfaces. During this process, the measurement of beam position deviation is repeated to converge the deflection field distortion to less than a desired value (step S3).

Distributions of the heights of the material surfaces are measured. A focus correction voltage for each point within the material surface is found from the heightwise distributions (step S4).

A deflection correction voltage for each point within the material surface is determined to cancel out the product $f_i \cdot V_F$ of the beam position deviation $f_i$ per unit focus correction voltage and the focus correction voltage $V_F$ found in step S4 (step S5).

According to the first embodiment of the present invention, beam position deviation accompanying a focus correction can be measured accurately. The beam position can be corrected based on the measured deviation.

According to the second embodiment of the present invention, a target surface that is different in height from the two measurement surfaces is set. A beam position deviation accompanying a focus correction for the target surface is found accurately. The beam position can be corrected based on the found deviation.

Other objects and features of the invention will appear in the course of the description thereof, which follows.

DESCRIPTION OF THE PREFERRED EMBODIMENTS

Figure 1:
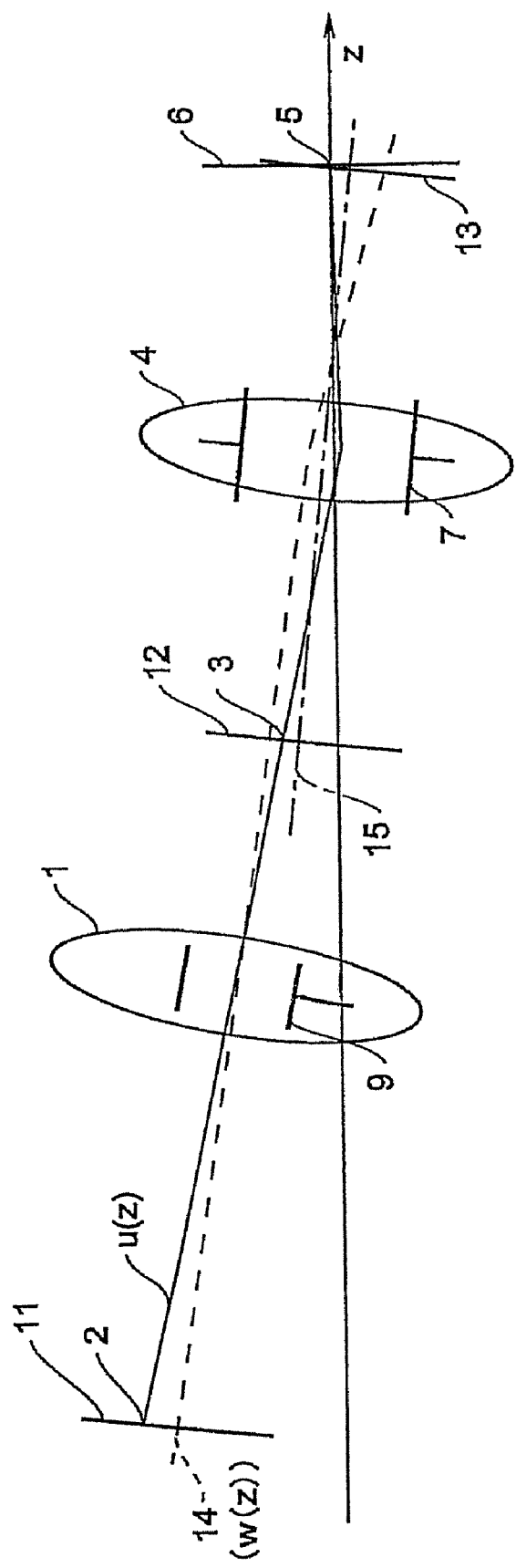
FIG. 1 is a ray diagram of an electron optical system shown in FIG. 3.

Embodiments of the present invention are hereinafter described in detail with reference to the drawings. The electron optical system of a charged-particle beam system proposed herein is fundamentally identical in configuration with the electron optical system shown in FIG. 3.

Embodiment 1

In this embodiment, before measurement of deflection field distortion, a beam position deviation accompanying a focus correction is found. The beam position is corrected based on the found deviation to reduce the deflection field distortion. Under this condition, the deflection field distortion is measured. The beam position is corrected to cancel out the distortion. The method of this embodiment is described below step by step.

(Step S1)

A deflection voltage $V_D$ expressed in terms of a complex number is applied to a deflector 7 to deflect an electron beam 8 to a target given by a plane coordinate $u_i=d_i \cdot V_D$ (complex number) (where $d_i$ is a plane coordinate (complex number) of the deflection orbit for the unit deflection voltage (the deviation $d(z)$ of the orbit on the paraxial image plane when a unit deflection voltage containing no aberration is applied), i.e., deflection sensitivity, on the paraxial image plane. This induces a focus deviation relative to a material surface 6. The focus deviation is found for each point within a deflection field. A focus correction voltage $V_F$ necessary to cancel out the focus deviation is determined. The focus correction voltage $V_F$ is defined by defining the voltage applied when the electron beam 8 is not deflected as an offset voltage and removing the offset voltage. That is, when $V_D=0$, $V_F=0$.

(Step S2)

Based on the result of step S1, i.e., the determined focus correction voltage $V_F$, focus correction voltages $V_{F1}$ and $V_{F2}$ for two arbitrary points (target beam positions) $u_{i1}=d_i \cdot V_{D1}$ and $U_{i2}=d_i \cdot V_{D2}$ that provide point symmetry with respect to the center of the deflection field are determined. Focus correction is made by applying the focus correction voltages $V_{F1}$ and $V_{F2}$ determined for the two points $u_{i1}$ and $u_{i2}$, respectively. At the same time, beam position deviations $dU_{i1}$ and $dU_{i2}$ produced by the focus correction are measured.

(Step S3)

The beam position deviation $f_i$ per unit focus correction voltage is approximately found from the beam position deviations $dU_{i1}$ and $dU_{i2}$ and from the focus correction voltages $V_{F1}$ and $V_{F2}$, using the relationship $f_i \cong (dU_{i1}+dU_{i2})/(V_{F1}+V_{F2})$.

(Step S4)

The product $f_i \cdot V_F$ corresponding to the beam position deviation accompanying a focus correction at each point within the deflection field is found from each focus correction voltage $V_F$ obtained in step S1 and from the beam position deviation $f_i$ per unit focus correction voltage found in step S3.

The deflection field distortion is measured by an electron beam 8 deflected while correcting the deflection voltage so as to cancel out the product $f_i \cdot V_F$ (beam position deviation accompanying a focus correction) while correcting the focus based on the focus correction voltage $V_F$ for each point within the deflection field. The aforesaid cancellation corresponds to correction of the beam position based on the beam position deviation. The distortion is found based on the difference between the value of a signal (e.g., a signal based on an absorption signal, a signal based on backscattered electrons, or a signal based on secondary electrons) obtained from a known microscopic pattern, such as a knife edge or mesh of a heavy metal, by scanning the pattern with the electron beam 8 and a given reference value.

(Step S5)

For each point within the deflection field, the focus is corrected based on the focus correction voltage $V_F$. At the same time, the electron beam 8 is deflected while correcting the deflection voltage so as to cancel out the sum of the beam position deviation $f_i \cdot V_F$ accompanying the focus correction and obtained in step S4 and the deflection field distortion measured in step S4.

At this time, the deflection field distortion newly produced by the focus correction is measured. A check is made to confirm that the deflection field distortion is less than the given reference value. If necessary, the measurement of the deflection field distortion and correction are repeated to converge the deflection field distortion to within the given reference value.

The deflection correction voltage obtained when the deflection field distortion converges within the given reference value in this way is taken as a final deflection correction voltage and stored in the memory (not shown) of the system.

When a pattern is written in practice, the final deflection correction voltage is added to a deflection voltage that specifies the electron beam position on the material. As a result, the beam position deviation accompanying a focus correction is corrected.

In this way, according to the present invention, beam position deviation accompanying a focus correction can be measured easily and accurately. The beam position is corrected based on the measured beam position deviation caused by focus correction and, therefore, the measured deflection field distortion is small. The deflection field distortion is measured in a short time. A deflection correction voltage that converges the beam position deviation caused by the measured deflection field distortion and the beam position deviation caused by the focus correction to within the reference value is added to the deflection voltage specifying the beam position on the material when a pattern is written in practice. Consequently, the pattern can be written accurately.

The principle of focus correction and the principle of a beam position deviation accompanying a focus correction are next described using mathematical formulas.

Figure 2:
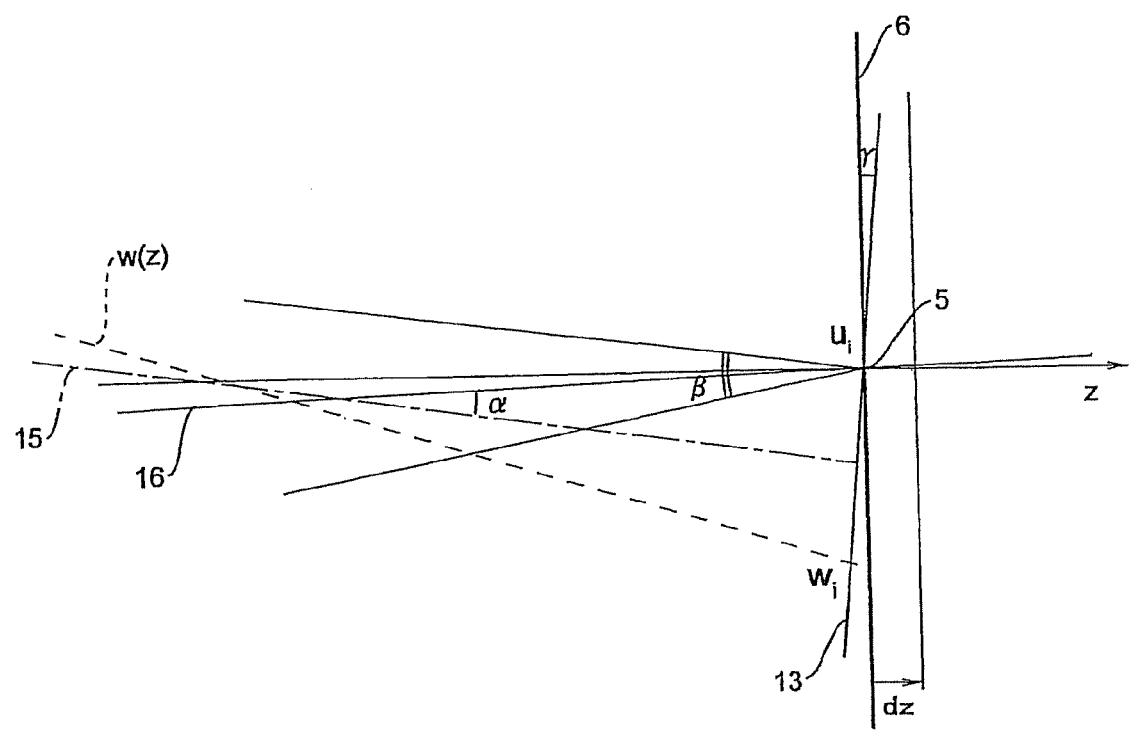
FIG. 2 is an enlarged diagram of the vicinities of the material surface shown in the ray diagram of FIG. 1.
Figure 3:
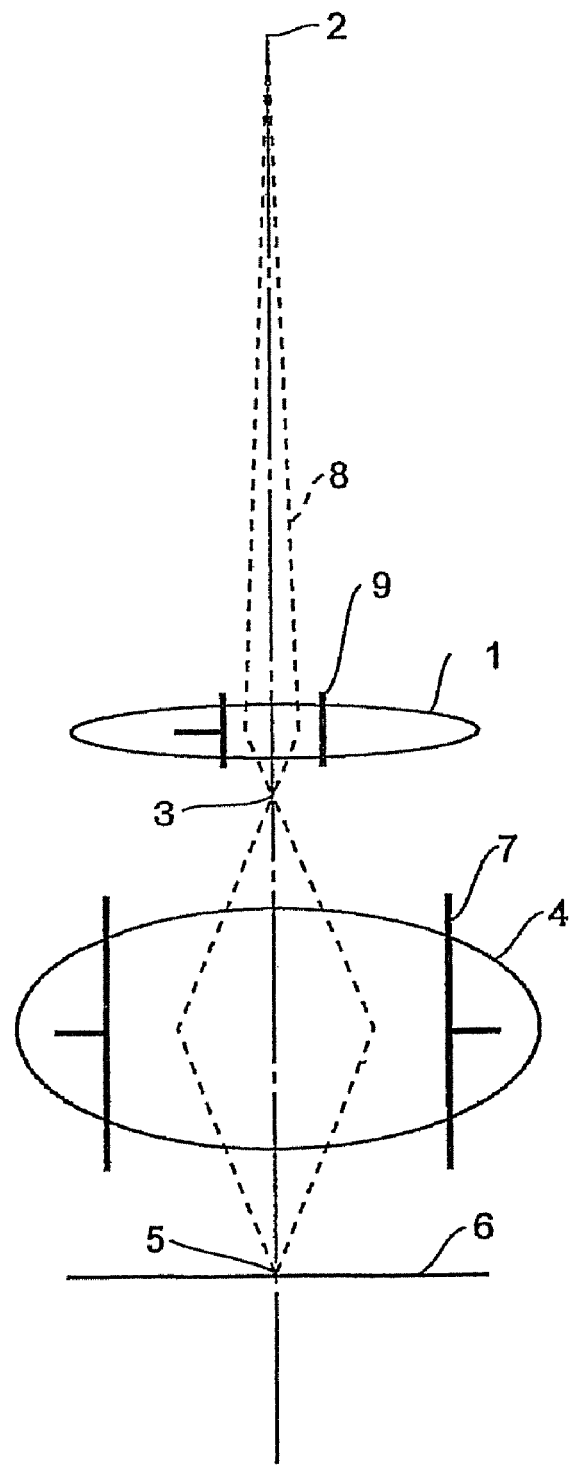
FIG. 3 is a schematic diagram of the electron optical system of an electron beam lithography system that is shown as an example of an electron optical system for use in a charged-particle beam system.

A ray diagram corresponding to the optical system of FIG. 3 is shown in FIG. 1. FIG. 2 is an enlarged diagram of the vicinities of the material surface 6. In various figures including FIG. 3, like components are indicated by like reference numerals.

It is assumed that the center axis 14 of the magnetic field produced by the first lens 1, the center axis 15 of the magnetic field produced by the second lens 4, and the Z-axis, or the center axis, of the optical axis are not parallel to each other. Ideally, these axes are parallel to each other and on the same straight line. In practice, they are not parallel to each other due to limitations of machining and assembly accuracies. For simplicity, the center axis of each magnetic field is regarded to be straight within the magnetic field. Note that it is assumed that the material surface 6 is vertical to the Z-axis.

It is assumed that the object plane 12 (image plane of the first lens 1) of the second lens 4 and the image plane 13 (paraxial image plane) of the second lens 4 are vertical to the center axis 15 of the magnetic field produced by the second lens 4 and that the paraxial image plane 13 is tilted relative to the material surface 6 by γ. The focus and beam position are measured at a surface (hereinafter referred to as the beam measurement surface) provided separately from the material surface 6. For the sake of simplicity, it is assumed that the beam measurement surface is parallel to the material surface 6. The intersection of the paraxial orbit (not including deflection of the beam by the deflector 7 or aberrations) $u(z)$ and the paraxial image plane 13 is brought into coincidence with the intersection of the Z-axis and the material surface 6.

Within the extent of the theory of third-order aberrations, the focus deviation and light ray position deviation $dU_i$ (complex number) produced in the system of FIGS. 1 and 2 are given by $$dU_i = Su'^2 \cdot \overline{u}'_i + A(u_i, \overline{u}_i, V_D, \overline{V}_D) \cdot u'_i + \quad (1)$$
$$B(u_i, \overline{u}_i, u'_i, \overline{u}'_i, V_D, \overline{V}_D) + (\Delta z + d_i \cdot V_D \cdot \gamma)(u'_i + \gamma + d'_i \cdot V_D) +$$
$$\{F_A \cdot (u'_i - w'_i) + F_B \cdot (u_i - w_i)\} \cdot V_F$$

In Eq. (1), the first term indicates the spherical aberration defined at the paraxial image plane 13. The second term indicates the curvature of field aberration defined at the paraxial image plane 13. The third term indicates the distortion aberration defined at the paraxial image plane 13. The fourth term indicates the position deviation and defocus of the light rays due to disagreement of the material surface 6 with the paraxial image plane 13. The fifth term indicates the position deviation and defocus of light rays which are defined at the paraxial image plane 13 and which accompany a focus correction. In practice, deflection aberrations, such as comatic aberration and astigmatism, other than curvature of field aberration and distortion aberration are also present. However, they are not discussed here. S is a spherical aberration coefficient.

$$A(u_i, \bar{u}_i, V_D, \bar{V}_D)$$

This is a function regarding curvature of field aberration and corresponds to deviation of the heightwise position of the focus.

$$B(u_i, \bar{u}_i, u_i', \bar{u}_i', V_D, \bar{V}_D)$$

This is a function representing a distortion aberration. $u_i$ indicates a plane coordinate $u(z_i)$ at the paraxial image plane 13 ($z=z_i$) of a paraxial orbit $u(z)$ originating from an object 2 (object point) having a plane coordinate $u_0$ on an object plane 11 of the first lens 1. $u_i'$ indicates the tilt $u(z_i)'$ at the paraxial image plane 13 of $u(z)$.

$u(z)$ is defined based on the center axis 15 of the magnetic field produced by the second lens 4. The position of $u_i$ is coincident with the intersection of the Z-axis and the material surface 6 as mentioned previously. Since the center axes 14 and 15 of the magnetic fields produced by the first lens 1 and second lens 4 are shifted from each other, if the coordinate $u_0$ is defined based on the center axis 14 of the magnetic field produced by the first lens 1, then $u_i$ does not agree with the product of $u_0$ and the projection magnification. Furthermore, it is assumed that the size of the object 2, i.e., the dimension of the beam on the object plane 11 of the first lens 1, is small enough to be neglected.

$V_D$ indicates the deflection voltage. $d_i$ indicates a plane coordinate $d(z_i)$ at the paraxial image plane 13 of the deflection orbit $d(z)$ (deviation (not shown) of the orbit per unit deflection voltage from the paraxial orbit $u(z)$) when a unit deflection voltage is applied, i.e., the deflection sensitivity. $d_i'$ indicates the tilt $d'(z_i)$ at the paraxial image plane 13 of $d(z)$. $d(z)$ is defined based on the center axis 15 of the magnetic field produced by the second lens 4. $\Delta z$ indicates the deviation of the material surface 6 in the direction of the Z-axis. $F_A$ and $F_B$ are focus correction coefficients. $V_F$ indicates a focus correction voltage.

$w_i$ indicates a plane coordinate $w(z_i)$ of the paraxial image plane 13 of an orbit $w(z)$ of electrons passing through the center axis 14 of the magnetic field produced by the first lens 1. The electrons passing in this orbit do not undergo a lens action from the first lens 1. However, the center axes 14 and 15 of the magnetic fields produced by the first and second lenses, respectively, are not on the same straight line and so the electrons can undergo a lens action from the second lens 4. $w_i'$ indicates the tilt $w'(z_i)$ of the orbit at the intersection. The plane coordinate $w(z_i)$ is defined based on the center axis 15 of the magnetic field produced by the second lens 4. If the center axes of the magnetic fields produced by the first and second lenses 1 and 4 and the electron orbit are tilted relative to the Z-axis, the tilts are on the order of 10 mrad at maximum. Consequently, variations in height of the focus (displacements in the Z-axis direction) can be regarded to be equal regardless of the tilt whatever axis is used as the reference.

We now introduce an equation $u_i' = \alpha + \beta \cdot e^{i\theta}$. Then, $$dU_i = S \cdot (\alpha^2 + \beta^2)(\alpha + \beta \cdot e^{i\theta}) + \qquad (2)$$
$$A(u_i, \bar{u}_i, V_D, \bar{V}_D)(\alpha + \beta \cdot e^{i\theta}) + B(u_i, \bar{u}_i, u_i', \bar{u}_i', V_D, \bar{V}_D) +$$
$$(\Delta z + d_i \cdot V_D \cdot \gamma)(\alpha + \beta \cdot e^{i\theta} + \gamma + d_i' \cdot V_D) +$$
$$\{F_A \cdot (\alpha + \beta \cdot e^{i\theta} - w_i') + F_B \cdot (u_i - w_i)\} \cdot V_F$$

where $\alpha$ is the tilt of the principal rays 16 (corresponding to $\beta=0$, i.e., light rays located in the center of the beam) relative to the center axis 15 of the magnetic field produced by the second lens at the paraxial image plane 13. $\beta$ is the convergence half angle of the beam at the paraxial image plane 13. $\theta$ is an angle defined under the condition where the principal rays 16 provide an axis of rotation.

If a focus correction is made and the focal point is brought to the material surface 6, then effects are produced that are equivalent to setting zero the sum of the terms of the first, second, fourth, and fifth terms which are associated with beam blur, i.e., the terms multiplied by $\beta \cdot e^{i\theta}$. If the focal point is successfully brought to the paraxial image plane 13 or material surface 6, the incident position of the light beam on the paraxial image plane 13 or on the material surface 6 does not depend on the tilt of the light beam. At this time, $dU_i$ indicates the beam position deviation.

However, because of the spherical aberration associated with light rays converging at angles less than the beam convergence half angle $\beta$, the beam defocus assumes a non-zero minimum value. A circle corresponding to the minimum blur is referred to as a circle of least confusion. Conditions under which the circle of least confusion is obtained are given by $$\frac{3}{4} S \cdot (\alpha^2 + \beta^2) \cdot \beta \cdot e^{i\theta} + A(u_i, \bar{u}_i, V_D, \bar{V}_D) \cdot \beta \cdot e^{i\theta} +$$
$$(\Delta z + d_i \cdot V_D \cdot \gamma) \cdot \beta \cdot e^{i\theta} + F_A \cdot V_F \cdot \beta \cdot e^{i\theta} = 0$$

This leads to:

$$V_F = -\left\{\frac{3}{4} S \cdot (\alpha^2 + \beta^2) + A(u_i, \bar{u}_i, V_D, \bar{V}_D) + \Delta z + d_i \cdot V_D \cdot \gamma\right\} / F_A \qquad (3)$$

If this condition is satisfied, Eq. (2) is rewritten into:

$$dU_i = S \cdot (\alpha^2 + \beta^2)(\alpha + \beta \cdot e^{i\theta})/4 + B(u_i, \bar{u}_i, u_i', \bar{u}_i', V_D, \bar{V}_D) + \qquad (4)$$
$$(\Delta z + d_i \cdot V_D \cdot \gamma)(\gamma + d_i' \cdot V_D) + \{F_B \cdot (u_i - w_i) - F_A \cdot w_i'\} \cdot V_F$$

The first term of Eq. (4) is
$$S \cdot (\alpha^2+\beta^2)(\alpha+\beta \cdot e^{i\theta})/4 = S \cdot (\alpha^2+\beta^2) \cdot \alpha/4 + S \cdot (\alpha^2+\beta^2) \cdot \beta \cdot e^{i\theta}/4$$

Of this equation, $S \cdot (\alpha^2+\beta^2) \cdot \beta \cdot e^{i\theta}/4$ corresponds to a circle of least confusion.

As can be seen from Eq. (4), $\{F_B \cdot (u_i-w_i) - F_A \cdot w_i'\} \cdot V_F$ indicates the beam position deviation accompanying a focus correction.

If the $\{F_B \cdot (u_i-w_i) - F_A \cdot w_i'\} V_F$ can be measured, then beam position deviation $f_i = F_B \cdot (u_i-w_i) - F_A \cdot w_i'$ per unit focus correction voltage is found. Consequently, the beam position deviation $f_i \cdot V_F$ accompanying a focus correction can be found for arbitrary focus correction voltage $V_F$.

Those components of Eqs. (3) and (4) which do not depend on $V_D, \overline{V}_D$ or on the deviation $\Delta z$ of the material surface 6 in the Z-axis direction can be treated as offset components. Therefore, in the following discussion, these offset components are neglected. That is, in the following description, Eqs. (3) and (4) are respectively changed into:

$$V_F = -\{A(u_i, \overline{u}_i, V_D, \overline{V}_D) + \Delta z + d_i \cdot V_D \cdot \gamma\}/F_A \quad (3')$$

$$dU_i = B(u_i, \overline{u}_i, u'_i, \overline{u}_i, V_D, \overline{V}_D) + \quad (4')$$
$$(\Delta z + d_i \cdot V_D \cdot \gamma)(\gamma + d'_i \cdot V_D) + \{F_B \cdot (u_i - w_i) - F_A \cdot w'_i\} \cdot V_F$$

where $A(u_i, \overline{u}_i, 0, 0) = 0$ and $$B(u_i, \overline{u}_i, u'_i, \overline{u}_i', 0, 0) = 0$$

Under the condition where the beam is focused onto the material surface 6 ($\Delta z = 0$), the beam is deflected and the resulting focus deviation is corrected. At this time, Eqs. (3') and (4') above are changed into the following forms:

$$V_F = -\{A(u_i, \overline{u}_i, V_D, \overline{V}_D) + d_i \cdot V_D \cdot \gamma\}/F_A \quad (5)$$

$$dU_i = B(u_i, \overline{u}_i, u'_i, \overline{u}_i, V_D, \overline{V}_D) + \quad (6)$$
$$d_i \cdot V_D \cdot \gamma \cdot (\gamma + d'_i \cdot V_D) + \{F_B \cdot (u_i - w_i) - F_A \cdot w'_i\} \cdot V_F$$

On the other hand, when focus correction is made to cancel out the deviation $\Delta z$ without deflecting the beam ($V_D = 0$), Eqs. (3') and (4') above are respectively changed into the forms:

$$V_F = -\frac{\Delta z}{F_A} \quad (7)$$

$$dU_i = \Delta z \cdot \gamma + \{F_B \cdot (u_i - w_i) - F_A \cdot w'_i\} \cdot V_F \quad (8)$$
$$= \{F_B \cdot (u_i - w_i) - F_A \cdot (w'_i + \gamma)\} \cdot V_F.$$

The simplest method for measuring a beam position deviation accompanying a focus correction consists of operating the focus corrector 9 while maintaining $\Delta z = 0$ and $V_D = 0$ to defocus the beam and measuring the resulting beam position deviation on the paraxial image plane 13 or on the material surface 6. If the beam position deviation accompanying focus correction is measured in such a way, the observed beam position deviation is given by $$\{F_A \cdot (\alpha - w_i') + F_B \cdot (u_i - w_i)\} \cdot V_F$$

This is the beam position deviation component (positional deviation of the principal rays) included in the fifth term of Eq. (2) above, the fifth term being given by $$\{F_A \cdot (\alpha + \beta \cdot e^{i\theta} - w_i') + F_B \cdot (u_i - w_i)\} \cdot V_F = F_A \cdot \beta \cdot e^{i\theta} \cdot V_F + \{F_A \cdot (\alpha - w_i') + F_B \cdot (u_i - w_i)\} V_F$$

On the other hand, $F_A \cdot \beta \cdot e^{i\theta} \cdot V_F$ is the beam defocus component. If a method of scanning a microscopic pattern, such as a knife edge or a mesh of a heavy metal with an electron beam is used, beam defocus and positional deviation can be measured independently. Therefore, even in a defocused state, the beam position deviation can be measured. However, the subject to be measured is $\{F_B \cdot (u_i - w_i) - F_A \cdot w'_i\} \cdot V_F$ as mentioned previously. That is, the difference between them, i.e., $F_A \cdot \alpha \cdot V_F$, is measurement error. This is the correction residue, or overcorrection or undercorrection. However, if $|F_A \cdot \alpha \cdot V_F| \ll |\{F_B \cdot (u_i - w_i) - F_A \cdot w_i\} V_F|$, i.e., if $|\alpha| \ll |F_B \cdot ((u_i - w_i)/F_A) - w'_i|$, then it may be conceivable that $\{F_B \cdot (u_i - w_i) - F_A \cdot w'_i\} \cdot V_F$ is approximately measured. In practice, it is difficult to measure or adjust the tilt $\alpha$. Further, it is difficult to find the center axis 15 of the magnetic field produced by the second lens 4. Where $V_D = 0$, the angle of incidence of the principal rays 16 on the material surface 6 is $\alpha + \gamma$.

Usually, the tilt $\alpha$ is determined as a result of an operation for making an alignment such that the principal rays 16 are brought into coincidence with the current axis of the second lens 4. On the current axis, if the lens excitation current is varied, the incident position of the principal rays on the paraxial image plane does not vary. The conditions under which this occurs are given by $$\{C_A \cdot \alpha + C_B \cdot u_i\} \cdot 2\Delta J/J = 0$$

That is, $\alpha = -C_B \cdot u_i/C_A$, where $C_A$ and $C_B$ are chromatic aberration coefficients regarding variation of the magnetomotive force (product of the excitation current and the number of turns of the coil) of the second lens 4, J is the magnetomotive force, and $\Delta J$ is the amount of variation of the magnetomotive force. The center axis 15 of the magnetic field produced by the second lens 4 corresponds to the current axis under a special condition of $\alpha = 0$.

The measurement error $F_A \cdot \alpha \cdot V_F$ occurs because the beam position is measured under a defocused condition. Accordingly, if the beam position is measured while making a focus correction, the desired beam position deviation $\{F_B \cdot (u_i - w_i) - F_A \cdot w'_i\} \cdot V_F$ should be measured. Such a method of measuring a beam position deviation and a method of correcting the beam position based on the measurement method are described below.

In Embodiment 1, the beam is deflected while the beam is focused onto the material surface 6 ($\Delta z = 0$). The resulting focus deviation is corrected by the following method.

First, focus correction voltages $V_{F1}$ and $V_{F2}$ for two arbitrary points $u_{i1} = d_i \cdot V_{D1}$ and $u_{i2} = d_i \cdot V_{D2}$ within a field plane are determined (step S1). Beam position deviations $dU_{i1}$ and $dU_{i2}$ at the points $u_{i1}$ and $u_{i2}$ are measured after the focus has been corrected (step S2). The beam position deviation $f_i$ per unit focus correction voltage is approximately found from the beam position deviations $dU_{i1}$ and $dU_{i2}$ and from the focus correction voltages $V_{F1}$ and $V_{F2}$, using a relationship given by $$f_i = F_B \cdot (u_i - w_i) - F_A w'_i \cong (dU_{i1} + dU_{i2})/(V_{F1} + V_{F2})$$

(step S3). At this time, if the following relationship holds:

$$|\{F_B \cdot (u_i - w_i) - F_A \cdot w'_i\} \cdot V_F| \gg |B(u_i \overline{u}_i, u'_i, \overline{u}_i', V_D, \overline{V}_D) + d_i \cdot V_D \cdot \gamma \cdot (\gamma + d'_i \cdot V_D)|$$

then, the accuracy of the approximation is improved. If the deviation $f_i$ is found, then the beam position deviation $f_i \cdot V_F = \{F_B \cdot (u_i - w_i) - F_A \cdot w'_i\} \cdot V_F$ accompanying a focus correction can be found for arbitrary $V_F$.

A measurement of a deflection field distortion is carried out by deflecting a beam at a number of points (e.g., 10×10=100 points) within a deflection field. In contrast, in a method according to the present embodiment, it is only necessary that the measurement be performed at two points within a deflection field and, hence, the measurement time is short.

Furthermore, in connecting two arbitrary points within a deflection field, if two points provide point symmetry with respect to the center of the deflection field, then the relationship $V_{D2} = -V_{D1}$ holds.

When $dU_{i1} + dU_{i2}$ included in $$f_i = F_B \cdot (u_i - w_i) - F_A \cdot w'_i \cong (dU_{i1} + dU_{i2})/(V_{F1} + V_{F2})$$

is found, odd-order beam position deviation components regarding the deflection voltage are canceled out. This improves the accuracy of approximation. With respect to the first-order beam position deviation components regarding the deflection voltage, there are beam position deviations caused by the fact that $d_i \cdot V_D \cdot \gamma^2$ included in the third term of Eq. (6), i.e., $d_i \cdot V_D \cdot \gamma \cdot (\gamma + d_i' \cdot V_D) = d_i \cdot V_D \cdot \gamma^2 + d_i \cdot d_i' \cdot V_D^2 \cdot \gamma$ and the deflection sensitivity $d_i$ are not correctly found.

With respect to the deflection voltage, the term $$V_D^2 \cdot \nabla_D$$

included in the first term $$B(u_i, \bar{u}_i, u_i', \bar{u}_i, V_D, \nabla_D)$$

of Eq. (6) exists as a third-order beam position deviation component. Because the main component of $\{F_B \cdot (u_i - w_i) - F_A \cdot w_i'\} \cdot V_F$ is a second-order beam position deviation component regarding the deflection voltage, the main component remains uncanceled. Note that the focus correction voltage $V_F$ has second-order characteristics regarding the deflection voltage. Furthermore, besides $\{F_B \cdot (u_i - w_i) - F_A \cdot w_i'\} \cdot V_F$, second-order beam position deviation components regarding the deflection voltage are present. They are measured while being added to $\{F_B \cdot (u_i - w_i) - F_A \cdot w_i'\} \cdot V_F$. Accordingly, if a beam position deviation correction is made to the result of the measurement, then they are removed together with $\{F_B \cdot (u_i - w_i) - F_A \cdot w_i'\} \cdot V_F$. That is, the presence of the second-order beam position deviation components other than $\{F_B \cdot (u_i - w_i) - F_A \cdot w_i'\} \cdot V_F$ makes it impossible to measure only the desired beam position deviation $\{F_B \cdot (u_i - w_i) - F_A \cdot w_i'\} \cdot V_F$. Rather, this satisfies the requirement that the deflection field distortion be reduced to a minimum before measurement. The second-order beam position deviation components arise from incompleteness of the optical system. If lenses, materials, and beam were all arranged symmetrically with respect to the Z-axis, the deflector were a complete 2n-pole element (where n is an integer), and the deflector were disposed on the Z-axis, then no second-order beam position deviation components would be produced regarding the deflection voltage.

The deflection correction voltage $\Delta V_D$ for the beam position deviation $\{F_B \cdot (u_i - w_i) - F_A \cdot w_i'\} \cdot V_F$ accompanying a focus correction is found from a correction condition given by $$\{F_B \cdot (u_i - w_i) - F_A \cdot w_i'\} \cdot V_F + d_i \cdot \Delta V_D = 0$$

That is, $\Delta V_D = \{F_A \cdot w_i' - F_B \cdot (u_i - w_i)\} \cdot V_F / d_i$ New distortion components are produced by correcting the deflection voltage by $\Delta V_D$, but they are removed together with other distortion components in subsequent steps.

In this way, the deflection correction voltage for the beam position deviation accompanying a focus correction is found. Then, measurement of deflection field distortions is carried out while correcting the focus and the resulting beam position deviation at each point within the deflection field. Consequently, deflection field distortions reduced by the beam position correction are measured (step S4).

Then, the sum of deflection field distortion and $f_i \cdot V_F$ is taken as the beam position deviation at each point. This beam position deviation is corrected (step S5).

As the deflection correction is made, new deflection field distortions are produced and, therefore, the measurement and correction of the deflection field distortion are repeated until the measured value becomes less than a given reference value. Strictly speaking, deflecting the beam for position correction results in defocusing. If necessary, the amount of correction to the focus is reset.

In this way, according to Embodiment 1, beam position deviation accompanying a focus correction can be measured accurately. An amount of correction for this is determined. Using the determined amount, the beam position can be corrected.

Embodiment 2

Embodiment 2 is similar in configuration with Embodiment 1 except that two beam measurement surfaces at different heights are used. The first object of Embodiment 1 is to correct the beam position deviation accompanying a focus correction before deflection field distortion is measured. The first object of Embodiment 2 is to correct the beam position deviation accompanying a focus correction made for variations in the height of the material surface 6.

In Embodiment 2, the following steps are carried out on the condition that beam positions measured at two beam measurement surfaces at different heights can be calibrated against each other.

Step S1

Focus correction voltages are found for the two beam measurement surfaces at different heights. At this time, the deflection voltage is set to 0. Let $\Delta z_1$ be the deviation of one of the two beam measurement surfaces in the Z-axis direction. Let $\Delta z_2$ be the deviation of the other in the Z-axis direction. The focus correction voltages are respectively given by $$V_{F1} = -\Delta z_1 / F_A \text{ and } V_{F2} = -\Delta z_2 / F_A$$

Step S2

Focus correction is made for the two beam measurement surfaces. At the same time, beam position deviations accompanying the focus correction at each beam measurement surface are measured, the beam position deviations being given by $$dU_{i1} = \{F_B \cdot (u_i - w_i) - F_A \cdot (w_i' + \gamma)\} \cdot V_{F1}$$

$$dU_{i2} = \{F_B \cdot (u_i - w_i) - F_A \cdot (w_i' + \gamma)\} \cdot V_{F2}$$

The beam position deviation per unit focus correction voltage is found from the beam position deviations $dU_{i1}$ and $dU_{i2}$ and from the focus correction voltages $V_{F1}$ and $V_{F2}$, the beam position deviation being given by $$f_i = (dU_{i2} - dU_{i1})/(V_{F2} - V_{F1})$$

$$= F_B \cdot (u_i - w_i) - F_A \cdot (w_i' + \gamma)$$

Step 3

The product $f_i \cdot (V_{F2} - V_{F1})$ of the beam position deviation $f_i$ and the difference $(V_{F2} - V_{F1})$ between the focus correction voltages for the beam measurement surfaces, respectively, is found while correcting the focus for the two beam measurement surfaces.

The electron beam is deflected while correcting the deflection voltage so as to cancel out the product. Whenever the correction is made, the beam position deviation is measured to check that the beam position deviation is within the given reference value. If necessary, the measurement of the beam position deviation and correction of the deflection voltage are repeated to converge the beam position deviation to within the reference value. The deflection voltage obtained when the beam position deviation is converged within the given reference value is determined as a final deflection correction voltage.

Step S4

The heightwise distribution of the material surface 6 (i.e., variation of the height of the material surface 6 at the beam incident position, caused by horizontal motion of the material stage) is measured. The focus correction voltage for each point within the material surface 6 is found from the heightwise distribution.

Step S5

The deflection correction voltage for each point within the material surface 6 is determined so as to cancel out the product $f_i \cdot V_F$ of the beam position deviation $f_i$ per unit focus correction voltage as described above and the focus correction voltage $V_F$ found in the step S4.

In this Embodiment 2, a beam position deviation accompanying a focus correction is $\{F_B \cdot (u_i - w_i) - F_A \cdot w_i'\} \cdot V_F$ as given by Eq. (8), in the same way as in Embodiment 1. In Embodiment 2, another beam position deviation $\Delta z \cdot \gamma = -F_A \cdot V_F \gamma$ arises from $\gamma$, also as given by Eq. (8). However, $\Delta z \cdot \gamma$ is measured together with the beam position deviation $\{F_B \cdot (u_i - w_i) - F_A \cdot w_i'\} \cdot V_F$ caused by the focus correction and, therefore, if the beam position is corrected based on the result of measurement, $\Delta z \cdot \gamma$ is removed together with $\{F_B \cdot (u_i - w_i) - F_A \cdot w_i'\} \cdot V_F$.

In the same way as in Embodiment 1, the deflection correction voltage is found from $\Delta V_D = \{F_A \cdot w_i' - F_{B \cdot (ui} - w_i)\} \cdot V_F / d_i$. Application of the deflection correction voltage shifts the beam position by an amount $\Delta z \, d_i' \cdot \Delta V_D$, which is negligibly small.

In practice, it is unlikely that only a focus correction is made for variation of the height of the material surface 6. A focus correction for focus deviation accompanying deflection of the beam is also made. When the beam is deflected, beam position deviation $\Delta z \cdot d_i' \cdot V_D$ occurs due to $\Delta z$. This is the second term of an expansion of the second term of Eq. (4'), the expansion being given by $$(\Delta z + d_i \cdot V_D \cdot \gamma)(\gamma + d_i' \cdot V_D) = \Delta z \cdot \gamma + \Delta z \cdot d_i' \cdot V_D + d_i \cdot V_D + d_i \cdot d_i' \cdot V_D \cdot \gamma$$

The beam position correction for the position deviation has been heretofore made by electron beam lithography systems. The beam position deviation, $\Delta z \cdot d_i' \cdot V_D$, is found by deflecting the beam on two beam measurement surfaces at different heights and measuring the beam position. The tilt $d_i'$ is found by measuring the beam positions $d_i \cdot V_{D1}$, $d_i \cdot V_{D2}$ and $d_i \cdot V_{D1} + \Delta z \cdot d_i' \cdot V_{D1}$, $d_i \cdot V_{D2} + \Delta z \cdot d_i' \cdot V_{D2}$ for different deflection voltages $V_{D1}$ and $V_{D2}$ and calculating $\Delta z \, d_i' \cdot (V_{D2} - V_{D1})$ from the measured values. Consequently, the beam position deviation, $\Delta z \, d_i' \cdot V_D$, is found at an arbitrary deflection voltage $V_D$.

In this way, according to the second embodiment, beam position deviation accompanying a focus correction made for variation of the height of the material surface 6 is accurately measured. The beam position can be corrected based on the result of the measurement.

In the above embodiments, an electron beam is used as a charged-particle beam. The present invention is not limited to this example. An ion beam can also be used.

Advantages of the Invention

The present invention yields the following advantages.

1) With respect to beam position deviation accompanying a focus correction made for a focus deviation due to deflection of a beam:

The focus is corrected so as to cancel out the curvature of field aberration caused by deflection. At the same time, the beam is deflected at two points within a deflection field. Beam position deviations (deviations from the beam position determined from a deflection orbit containing no aberrations) at these points are measured.

Especially, when the two arbitrary points as described above are selected, two points providing point symmetry with respect to the center of the deflection field are selected.

As a result, the beam position deviation accompanying a focus correction can be measured without being affected by the measurement error $F_A \cdot \alpha \cdot V_F$ arising from the tilt $\alpha$ of the principal rays to the paraxial image plane. The beam position can be corrected based on the result of the measurement.

At the same time, second-order distortion components that are other than the beam position deviation accompanying the focus correction and are about the deflection voltage are also measured and removed.

The field distortion measured by measurement of deflection field distortion is reduced by measuring those positional deviation components and making a beam position correction for the components before the measurement of the deflection field distortion. Also, the accuracy of measurement is improved. In addition, the measurement time is shortened.

2) With respect to a beam position deviation accompanying a focus correction made for variation of the height of the material surface:

A focus correction is made for two beam measurement surfaces at different heights. At the same time, beam position deviation accompanying the focus correction is measured at each beam measurement surface.

As a result, the beam position deviation accompanying the focus correction can be measured without being affected by the measurement error $F_A \alpha \cdot V_F$ arising from the tilt $\alpha$ of the principal rays to the paraxial image plane. The beam position can be corrected based on the result of the measurement.

At the same time, a beam position deviation $\Delta z \cdot \gamma$ arising from tilt $\gamma$ of the paraxial image plane relative to the material surface is measured and removed.

Having thus defined my invention with the detail and particularity required by the Patent Laws, what is desired protected by Letters Patent is set forth in the following claims.

The invention claimed is:

1. A method of calibrating a beam position in a charged-particle beam system in which a focused charged-particle beam is made to hit a material at an arbitrary position by deflecting the beam, said method comprising the steps of:

finding a focus deviation on a material surface accompanying beam deflection performed by application of a deflection voltage of $V_D$ to a deflector for each point within a deflection field and determining a focus correction voltage $V_F$ necessary to cancel out the focus deviation;

determining focus correction voltages $V_{F1}$ and $V_{F2}$ about two arbitrary points given by $u_{i1} = d_i \cdot V_{D1}$ and $u_{i2} = d_i \cdot V_{D2}$, respectively, based on the determined correction voltage, the two points providing point symmetry with respect to the center of a deflection field, and measuring beam position deviations $dU_{i1}$ and $dU_{i2}$ at the points $u_{i1}$ and $u_{i2}$, respectively, under a focus-corrected condition;

finding a beam position deviation $f_i$ per unit focus correction voltage from the beam position deviations $dU_{i1}$ and $dU_{i2}$ and from the focus correction voltages $V_{F1}$ and $V_{F2}$;

measuring a deflection field distortion while correcting the deflection voltage so as to cancel out the product $f_i \cdot V_F$ of the focus correction voltage $V_F$ and the beam position deviation $f_i$ while making a focus correction based on the obtained focus correction voltages $V_F$ at each point within the deflection field;

correcting the deflection voltage so as to cancel out the sum of the product $f_i \cdot V_F$ and the measured deflection field distortion while making a focus correction based on the obtained focus correction voltage $V_F$; and repeating the measurement of the deflection field distortion while correcting the deflection voltage so as to cancel out the sum to converge the deflection field distortion to less than a given value.

2. A method of calibrating a beam position in a charged-particle beam system in which a focused charged-particle beam is made to hit a material at an arbitrary position by deflecting the beam such that beam positions measured at two beam measurement surfaces at different heights can be calibrated with each other, said method comprising the steps of:

finding focus correction voltages $VF_1$ and $VF_2$ for the two beam measurement surfaces at the different heights;

measuring beam position deviations $dU_{i1}$ and $dU_{i2}$ accompanying a focus correction at each beam measurement surface while making the focus correction for each of the two beam measurement surfaces to thereby find a beam position deviation $f_i$ per unit focus correction voltage;

correcting the deflection voltage so as to cancel out the product ($f_i \cdot (V_{F2} - V_{F1})$) of the beam position deviation $f_i$ and the difference ($V_{F2} - V_{F1}$) between the focus correction voltages for the beam measurement surfaces, respectively, while making a focus correction on the two beam measurement surfaces;

repeating the measurement of the beam position deviation while correcting the deflection voltage so as to cancel out the product to converge the beam position deviation to less than a given value;

measuring a heightwise distribution of the material surface and finding a focus correction voltage for each point within the material surface from the heightwise distribution; and determining a deflection correction voltage for each point within the material surface to cancel out the product $f_i \cdot V_F$ of the beam position deviation $f_i$ per unit focus correction voltage described above and the found focus correction voltage $V_F$.

* * * * *

UNITED STATES PATENT AND TRADEMARK OFFICE
CERTIFICATE OF CORRECTION

PATENT NO.         : 8,193,511 B2
APPLICATION NO.    : 12/351276
DATED              : June 5, 2012
INVENTOR(S)        : Kazuya Goto Page 1 of 1

It is certified that error appears in the above-identified patent and that said Letters Patent is hereby corrected as shown below:

Column 15, Line 7, Claim 2, delete "VF1 and VF2" and insert -- $V_{F1}$ and $V_{F2}$ --

Signed and Sealed this
Twenty-fifth Day of September, 2012

David J. Kappos
*Director of the United States Patent and Trademark Office*